United States Patent [19]

Chen et al.

[11] Patent Number: 4,602,981

[45] Date of Patent: Jul. 29, 1986

[54] MONITORING TECHNIQUE FOR PLASMA ETCHING

[75] Inventors: Lee Chen; Gangadhara S. Mathad, both of Poughkeepsie, N.Y.

[73] Assignee: International Business Machines Corporation, Armonk, N.Y.

[21] Appl. No.: 730,969

[22] Filed: May 6, 1985

[51] Int. Cl.[4] .................. H01L 21/306; B44C 1/22; C03C 15/00; B29C 17/08

[52] U.S. Cl. ............................ 156/627; 156/643; 156/646; 156/345; 204/192 E; 204/298

[58] Field of Search ............... 156/626, 627, 643, 646, 156/657, 662, 659.1, 668, 345; 204/192 E, 298; 324/71.1, 71.2, 71.5, 72, 76 R, 78 R, 464

[56] References Cited

U.S. PATENT DOCUMENTS 4,207,137 6/1980 Tretola ............................ 156/627
4,358,338 11/1982 Downey et al. ................. 156/627
4,362,596 12/1982 Desilets et al. ................... 156/627

FOREIGN PATENT DOCUMENTS 58-79722 5/1983 Japan ............................. 156/627
0158929 9/1983 Japan ............................. 156/345

Primary Examiner—William A. Powell
Attorney, Agent, or Firm—Douglas A. Lashmit

[57] ABSTRACT

Plasma potential monitoring during a plasma etching process is accomplished by measuring the RF voltage at an electrode of, for example, a high pressure, high plasma density, symmetric single wafer reactor. The plasma potential is indicative of the plasma density, which has a high sensitivity to secondary electron emission from a wafer surface and yields both process etching endpoint and diagnostic information for a wide variety of processes and process conditions.

5 Claims, 7 Drawing Figures

MONITORING TECHNIQUE FOR PLASMA ETCHING

BACKGROUND OF THE INVENTION

The present invention relates to plasma etching processes and, more particularly, to a method for monitoring and for terminating the etch process at the proper time based on the data gathered by measuring the RF voltage in the plasma reactor.

Major efforts in the semiconductor industry have been made to develop plasma etch processed to define fine line geometries in integrated circuit devices. Such processes typically occur in a reactive ion etch (RIE) reactor where the semiconductor device is placed in a chamber on an electrode, a reactive gas is introduced, and an electrical discharge alternating at an RF frequency is applied across the two electrodes in the reactor. This creates a highly reactive plasma which reacts with material on the semiconductor device, producing a volatile gas which can be pumped out of the chamber. The surface to be etched is generally masked by photoresist or other suitable material to define the fine line geometry.

While plasma etch processes have been shown to be useful in defining microminiature features, care must be exercised to control the reaction such that sufficient, yet not excessive etching takes place. If the etching process is ended prematurely the mask pattern will not be completely defined, and if the process continues too long, undercutting, excessive attack of underlying layers, and other problems can result. Nonuniformities in film thickness, variations in film properties which cause variation in etch rates, as well as changes in the plasma etch characteristics form wafer to wafer or between successive batches of wafers render the use of a fixed process time an inexact means for terminating the etch process.

Several approaches for determining endpoint have been described in the art. One method involves the use of laser interferometry on either a monitor wafer or a particular site on product wafers. The laser measures the thickness of the film removed as the etch process proceeds and endpoint is signaled after the film is etched away, plus some additional etch time afterwards. A disadvantage of this method is that frequently the film thickness of the monitor wafer or monitor site is not the same as that on the product chips on the wafer. This is due to the need for a uniform pattern area large enough for the laser to register. Further, the apparatus used for laser endpoint detection is not suitable for installation in all plasma reactors.

Another apporach is to detect changes in the optical emission spectra of the reaction and to stop the plasma etch process when a given spectral fingerprint is achieved. Although this method does reflect the bulk process across all of the wafers, it requires a complex system of filters, monochromators and photomultiplier tubes.

In U.S. Pat. No. 4,358,338 to Downey et al., the plasma etching endpoint is determined by measuring the changes in current at the surface of a workpiece.

U.S. Pat. No. 4,207,137 to Tretola discloses a method for monitoring the impedance of the plasma during the reaction. The impedance is measured in an asymmetric low pressure RIE reactor in which the wafers are loaded batch-wise on the lower electrode. The plasma is turned off once the impedance reaches a minimum or a maximum value and the monitor trace is essentially flat, i.e., it does not change with time, or some predetermined time thereafter. A substantial area of the lower electrode is not covered by the semiconductor wafers to be etched, and this area remains a relatively constant source of secondary electrons for the plasma. Thus, the plasma impedance will only be sensitive to rather large changes such as etching through an entire layer of material to expose a layer of different material. This method can not detect subtle changes in the material being etched and may not be sufficiently sensitive for the increasingly small geometries used in current integrated circuit technologies. Also, the measurement of impedance mismatch between the plasma and the RF source is somewhat difficult and complex.

SUMMARY OF THE INVENTION

It is therefore an object of the present invention to provide an improved and less complex method of determining the endpoint of a plasma etching process, particularly in a single wafer reactor of high plasma density.

It is a further object of this invention to provide a monitoring technique sufficiently sensitive to detect changes in the plasma during etching so that other diagnostic information may be gathered.

These and other objects are achieved by the present method for endpoint detection wherein the plasma potential is monitored using simple RF instrumentation for determining the plasma density. A change in plasma density at an etch interface is reflected by a change in plasma potential, which signals the etch endpoint. Under constant RF power, increasing plasma density during the etch is indicated by a decreasing value for the plasma potential.

The present invention may advantageously by used in connection with a symmetric, high pressure, high plasma density, narrow gap single wafer reactor.

DETAILED DESCRIPTION OF THE PREFERRED EMBODIMENT

The invention will be described with reference to the aforementioned symmetric, high pressure, high plasma density single wafer reactor shown in FIG. 1. While the invention can be modified for use with other types of plasma reactors, the high sensitivity of plasma density to secondary electron emission makes the monitoring of plasma potential in this type of reactor particularly advantageous. In the single wafer reactor shown, nearly the entire lower electrode is covered by the wafer to be etched. Since the upper electrode area remains constant, the changes in plasma density at etch emdpoint, for a given reactive gas, are due to the changes at the wafer surface.

Figure 1:
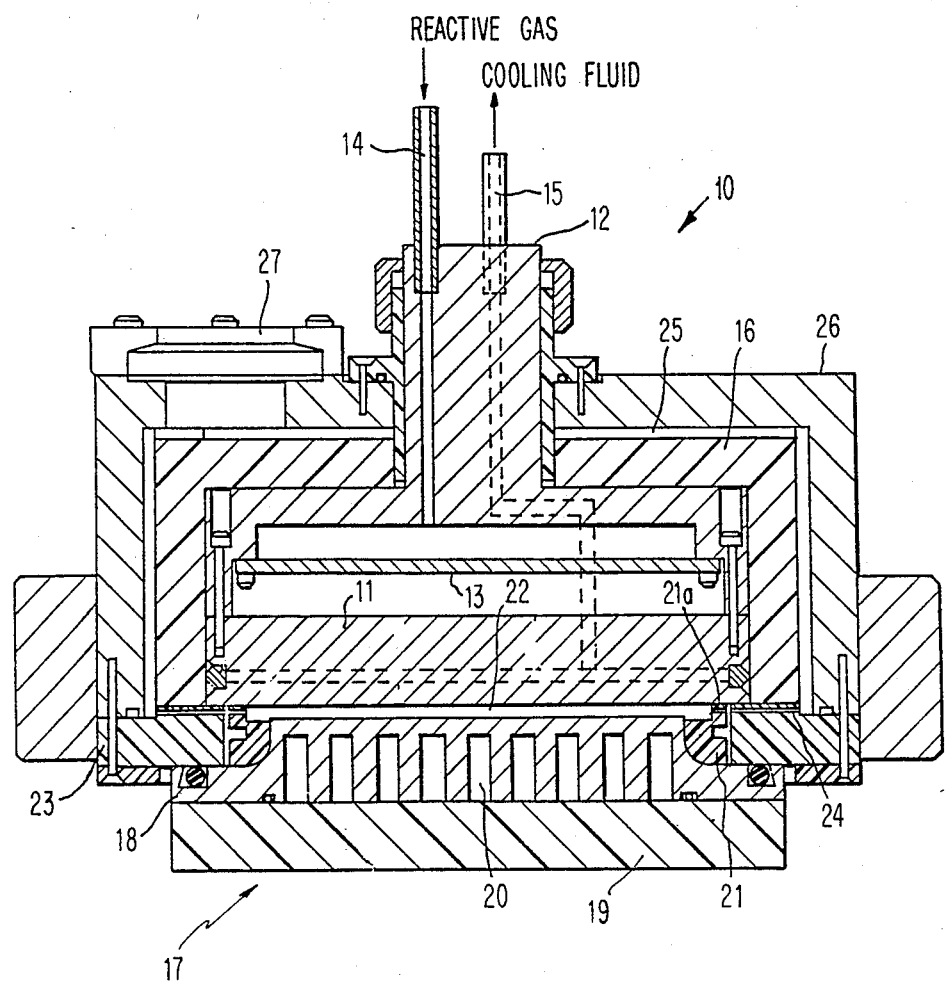
FIG. 1 is a cross-sectional view in elevation of a symmetric high pressure, high plasma density single wafer reactor which may be used in connection with the present invention.

Referring to FIG. 1, there is shown a single wafer reactor 10 having a circular, electrically grounded upper electrode 11 attached to a cylindrical housing 12. Housing 12 has a gas distributing baffle 13, a reactive gas inlet 14, and a cooling fluid inlet (not shown) and outlet 15. This assembly is contained within an insulating housing 16. A lower electrode 17 includes a conductive upper section 18 and an insulating lower section 19. Upper section 18 has cooling channels 20 and a raised portion surrounded by an insulating ring 21 with gas exhaust channels 21a. The spacing 22 between the upper 11 and lower 17 electrodes is set at approximately 4 mm. An insulating ring 23, which electrically isolates the two electrodes, includes conduits 24 for exhausting the reactive gas from the interelectrode gap. These conduits 24 open into a gap 25 between inner housing 16 and outer housing 26. The reacted gases are then exhausted from the system through port 27. Reactor 10 is similar in design to that described in U.S. patent application Ser. No. 623,670 of Chen et al., filed June 22, 1984, U.S. Pat. No. 4,534,816 and assigned to the present assignee, which is incorporated herein by reference.

Figure 2:
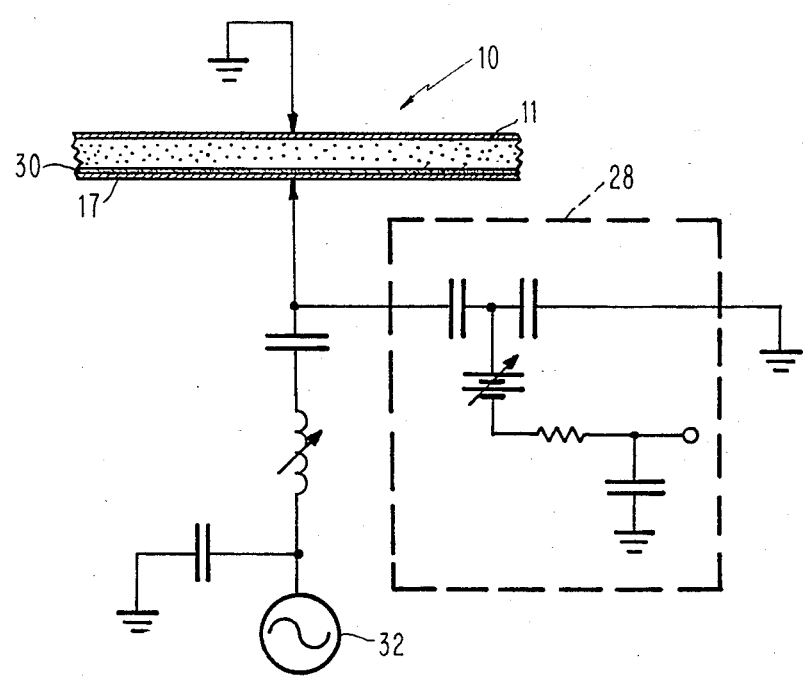
FIG. 2 is a schematic diagram of an RF voltage probe used in carrying out the method of the present invention.

Referring now to FIG. 2, the present RF probe 28, indicated by dashed lines, is simple in construction. A capacitor divider is used to measure the RF voltage, $V_{RF}$, peak to ground. Upper electrode 11 of reactor 10 is grounded and the wafer 30 to be etched is placed on lower electrode 17, which is connected through a matching network to an RF source 32.

The plasma potential, $V_p$, is expressed by the equation $$V_p = V_{RF}/2 - V_{dc}$$

where $V_{dc}$ is the DC self-bias voltage. In the case of an electrically symmetric reactor, $V_{dc}=0$. By monitoring $V_{RF}$, the changes in plasma potential, and therefore, the changes in plasma density due to secondary electron emission inside the reactor can be monitored.

Process diagnostic information is also available from the $V_{RF}$ information. It has been found that slight changes in reactive gas composition produce a recognizable change in the trace of $V_{RF}$. In reactors with highly confined plasma, secondary electrons emitted from the films on the wafer being etched cause dissociation reactions in the etchant gas which result in changes in the plasma density. Therefore, plasma density is a function not only of the film exposed to the plasma, but also the type of gas or gas mixture used. The present sensitive $V_{RF}$ probe technique can thus provide information on changes or discrepancies in film or gas compositions. In addition to the uses of the invention to determine etch endpoint, it is useful for process diagnostics in real time, process problem determination and process control.

A first example of an application of the present method for process diagnostics will be described with reference to FIGS. 3A-3D, which depict the $V_{RF}$ traces during the etching of an organic film in an $O_2$-$N_2$ plasma. The film used was an AZ135OJ photoresist coating on a silicon wafer. As seen from the trace, not only is the endpoint 34 of resist etching indicated, but also the characteristics of the plasma during the etch process are shown. The traces change significantly with changes in gas composition. Point 36 in FIG. 3B indicates the transition from resist to silicon, and point 38 on each trace is where the reactor RF power was turned on. Any deviation from the normal trace is indicative of a change in the process or reactor parameters. This can alert an operator or a control system that something has deviated, probably undesirably, from the standard process. In the cases shown in FIGS. 3A-3D, the changes in the traces are due to differences in $N_2$ concentration. Note the segment 39 of the traces as the %$N_2$ is increased.

Figure 4:
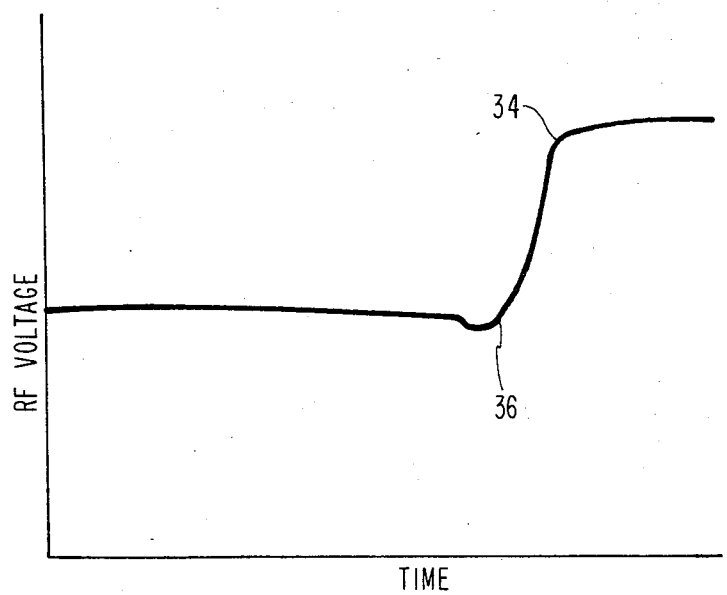
FIG. 4 is a graphical representation of an RF voltage trace showing the resulting RF voltage when etching through an interface between photoresist and quartz.
Figure 3A:
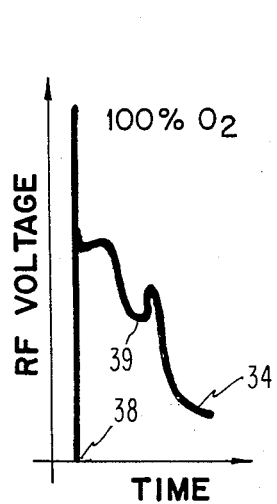
FIGS. 3A-3D are graphical representations of RF voltage traces showing the resulting RF voltage changes for different etchant gas compositions.
Figure 3B:
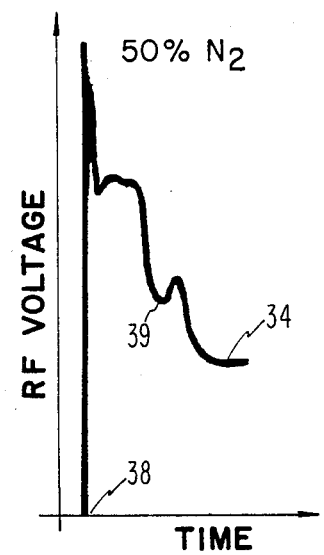
Figure 3C:
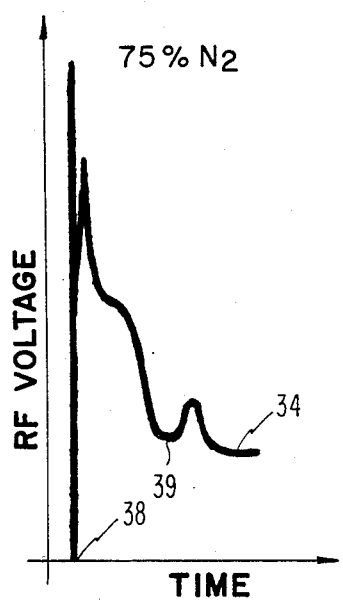
Figure 3D:
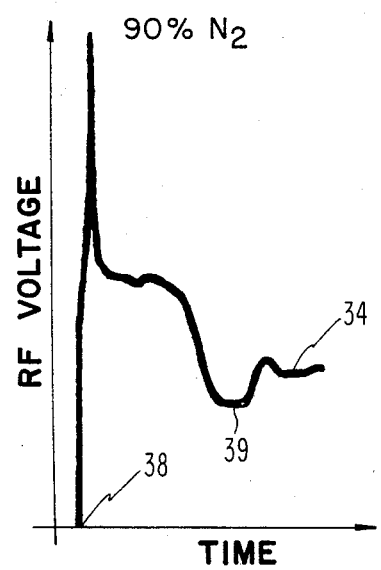

A second application of the invention is its use as a method of endpoint determination. Referring to FIG. 4, the $V_{RF}$ trace results when etching a photoresist, for example, AZ1350J, over quartz in a $CF_4$ plasma. It can be seen that near the end of the process at point 40, there is a significant change in plasma potential at point 42 when quartz is being exposed to the plasma. The sharpness of this change indicates that the resist was cleared over the entire surface of the wafer in a short period of time. This suggests that both the resist coating and the etch rate were very uniform across the wafer.

A third application of the present method involves the etching of an isolation trench through two layers of silicon, the top layer being, for example, heavily n-doped polysilicon. The $V_{RF}$ changed from about 90 volts to about 45 volts as the etching proceeded through the heavily n-doped layer to an underlying lightly p-doped layer.

While the present invention has been particularly shown and described with reference to the preferred embodiments thereof, it will be understood by those skilled in the art that various changes in form and details may be made therein without departing from the spirit and scope of the invention.

What is claimed is:

1. A method of monitoring the etching process within a plasma etching apparatus, comprising:
   measuring the RF voltage at an electrode of said etching apparatus, the RF voltage being a function of the plasma potential; and
   detecting changes in RF voltage as the RF voltage changes within said apparatus as the result of film-dependent changes.

2. The method of claim 1, further comprising:
   determining the endpoint of the etch process based upon changes in said RF voltage at the interface of an etch layer and an underlying layer on a wafer being etched; and
   terminating said etching process when said endpoint is obtained or a predetermined time thereafter.

3. The method of claim 1, further comprising:
   recording changes in said RF voltage during said etching process for process and system diagnostics.

4. A method of detecting the passage from one layer to another layer on a wafer being etched in a plasma etching apparatus, said layers being different materials, comprising:
   measuring the RF voltage at an electrode of said plasma apparatus; and
   detecting a change in said RF voltage indicative of a change in plasma density at said another layer.

5. The method of claim 4, wherein said two layers comprise silicon having different doping characteristics.

* * * * *